United States Patent
Choy et al.

(10) Patent No.: US 6,794,337 B1
(45) Date of Patent: Sep. 21, 2004

(54) SUPERCONDUCTING COLLOIDS, SUPERCONDUCTING THIN LAYERS PRODUCED THEREFROM, AND PROCESSES FOR PRODUCING THEM

(75) Inventors: Jin Ho Choy, 28 Tong 4 Ban, Shinlim Hyundai Apartment 112-702, Shinlim-dong 1694, Kwanak-ku, Seoul 151-761 (KR); Soon Jae Kwon, Seoul (KR); Eui Soon Chang, Seoul (KR)

(73) Assignee: Jin Ho Choy, Seoul (KR)

( * ) Notice: Subject to any disclaimer, the term of this patent is extended or adjusted under 35 U.S.C. 154(b) by 401 days.

(21) Appl. No.: 10/030,228

(22) PCT Filed: May 8, 2000

(86) PCT No.: PCT/KR01/00739

§ 371 (c)(1),
(2), (4) Date: Jan. 8, 2002

(87) PCT Pub. No.: WO01/86733

PCT Pub. Date: Nov. 15, 2001

(30) Foreign Application Priority Data

May 8, 2000 (KR) .......................................... 2000-24277

(51) Int. Cl.⁷ .......................... C01G 29/00; C01G 3/00; C01F 11/00; B01F 3/12; H01L 39/00
(52) U.S. Cl. ....................... 505/100; 505/121; 505/125; 505/725; 505/782; 264/109; 252/519.13; 252/519.15

(58) Field of Search ................................. 505/100, 121, 505/125, 230, 725, 782; 264/109; 516/33, 11, 89; 252/519.13, 519.15; 423/27, 28, 579

(56) References Cited

FOREIGN PATENT DOCUMENTS

KR          1999-30516 A      5/1999

OTHER PUBLICATIONS

Jin–Ho, Choy et al., New Superconducting Intercalation compounds (HgX2) 0.5Bi2rS2CaCu2Oy (x=Br and I) J.Am. Chem. Soc., 1994, 116, p. 11564–11565.

X.D.Xiang et al., 'Iodine intercalation of a high–temperature superconducting oxide', Nature, Nov. 1990, vol. 348, No. 8 p. 145–147.

Primary Examiner—Yogendra N. Gupta
Assistant Examiner—Kallambella Vijayakumar
(74) Attorney, Agent, or Firm—Sughrue Mion, PLLC

(57) ABSTRACT

The present invention relates to a superconducting colloid prepared by an exfoliating multi-layered superconductor, represented by the formula $Bi_2Sr_2Ca_{m-1}Cu_mO_{2m+4+\delta}$ (wherein, m is 1, 2 or 3 and δ is a positive number greater than 0 and less than 1) in which a mercuric halide-organic complex is intercalated, a process thereof, a superconducting thin layer prepared using the above superconducting colloid, and a process thereof.

15 Claims, 21 Drawing Sheets

Fig. 6 (1)
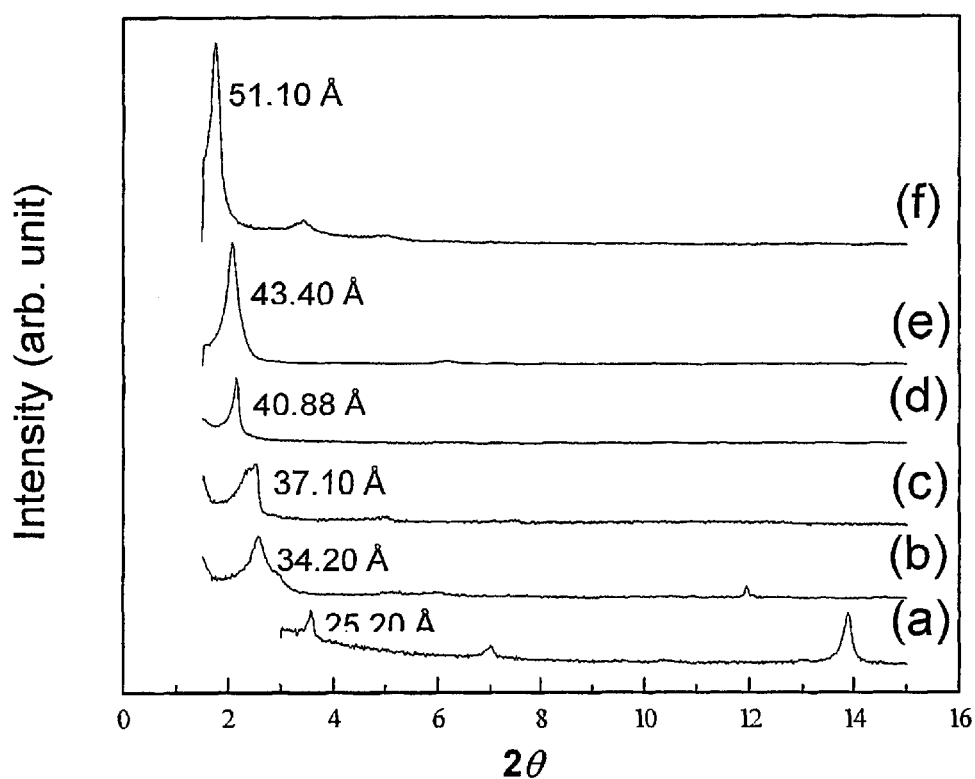
Fig. 6 (2)
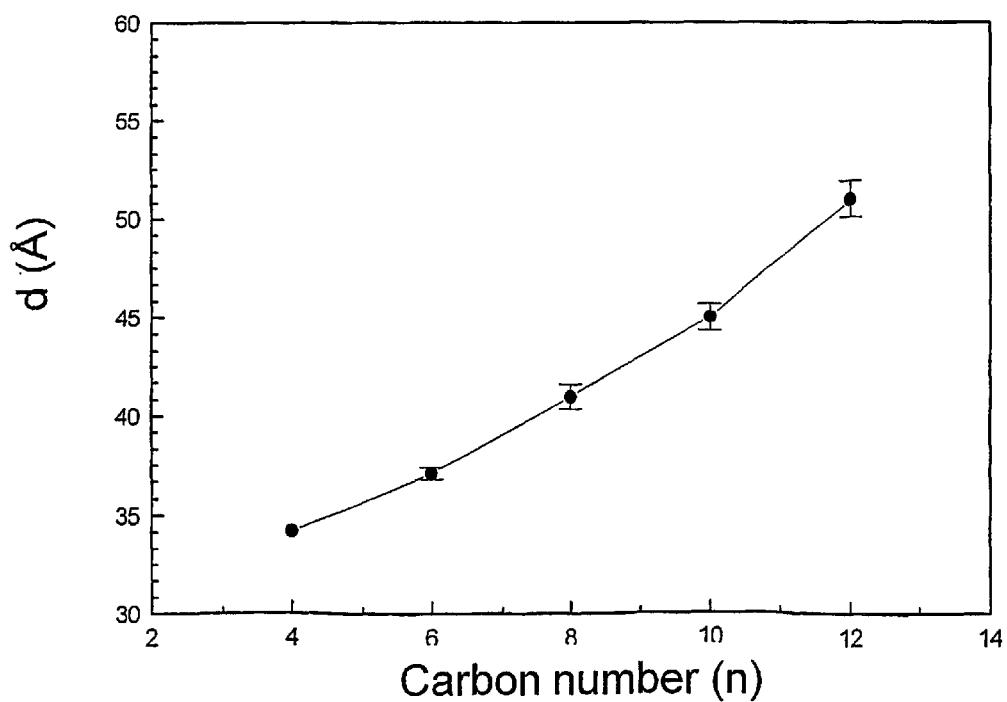

Fig. 8
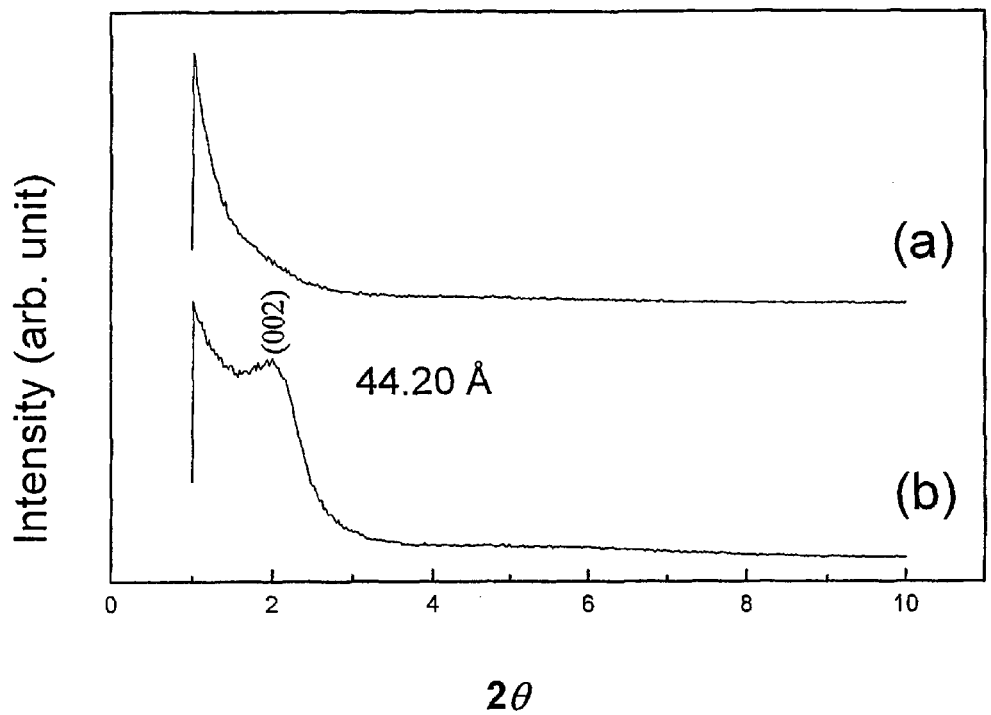
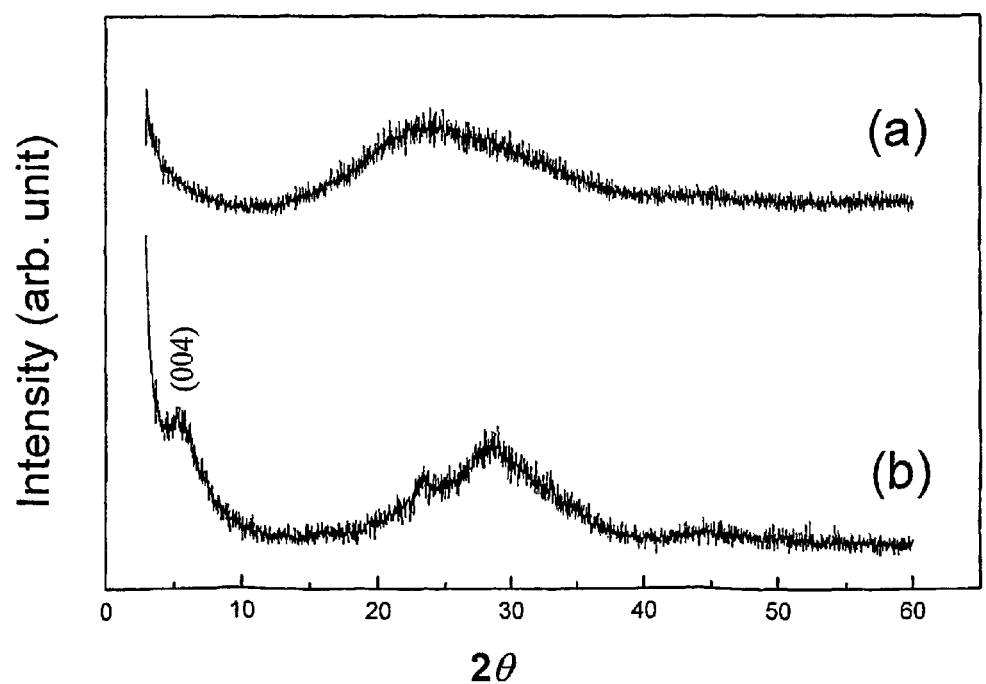

Fig. 10
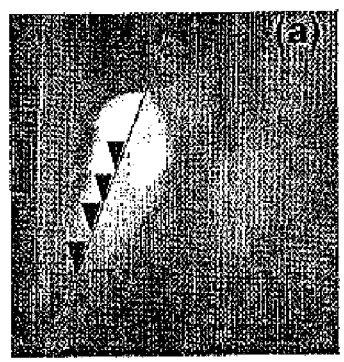 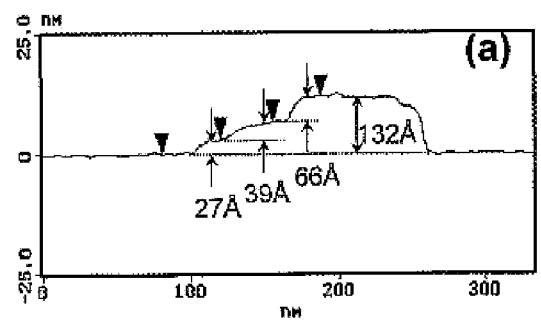
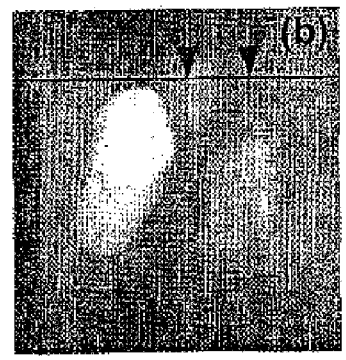 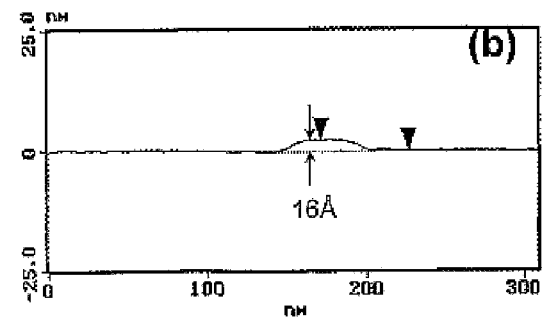

Fig. 11
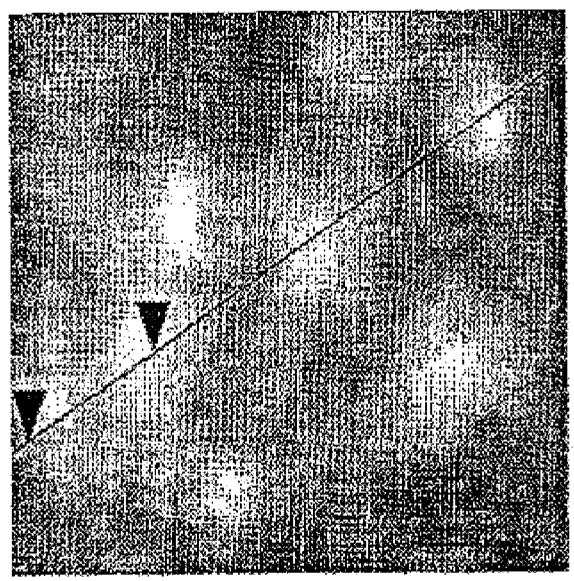
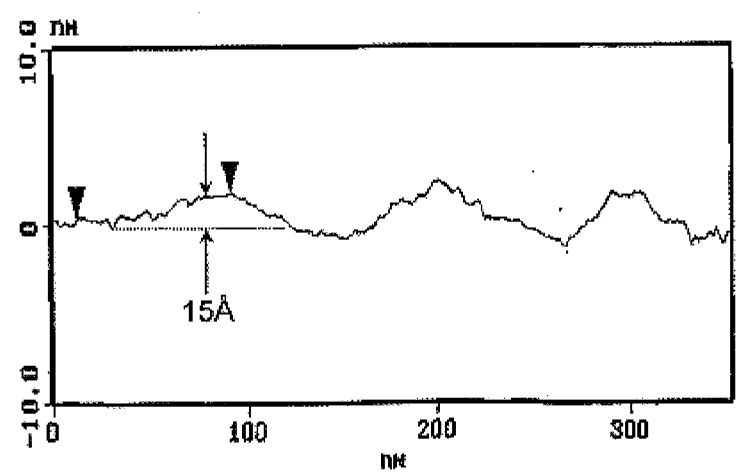

Fig. 12
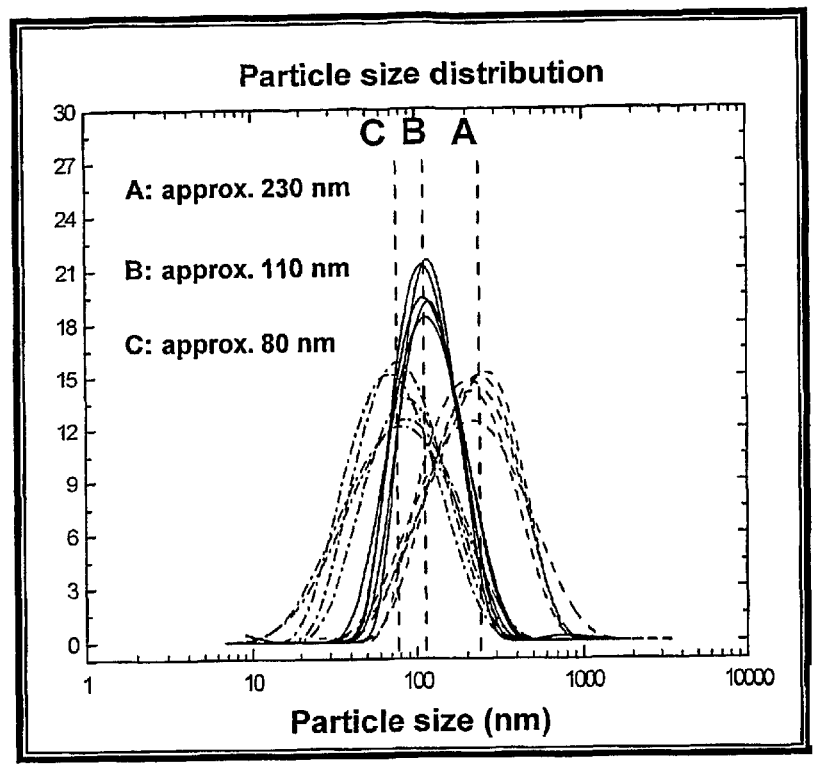
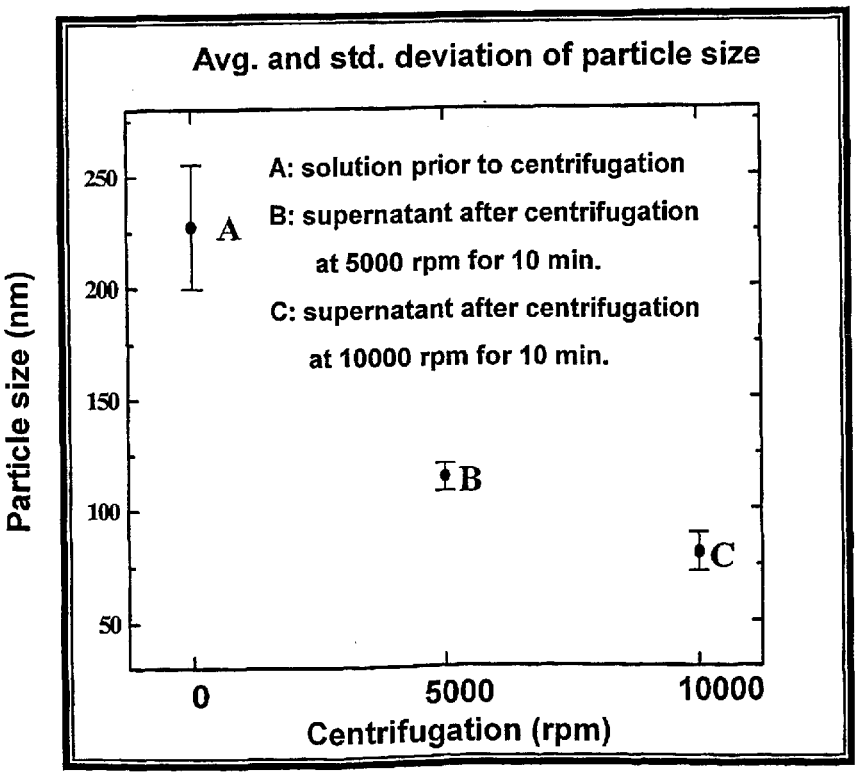

Fig. 19
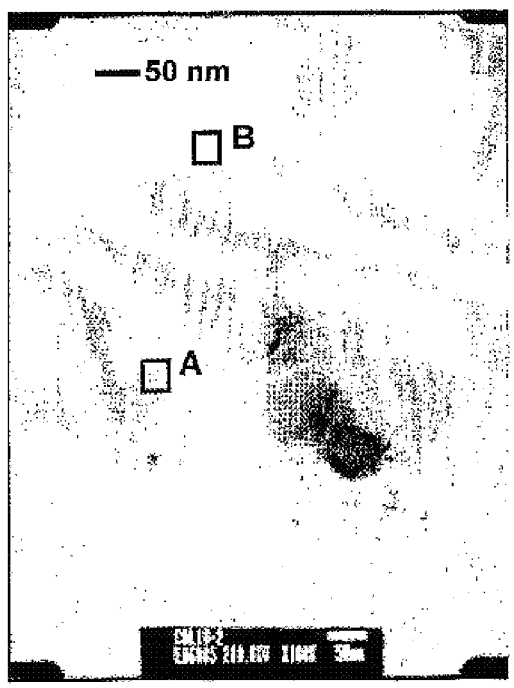
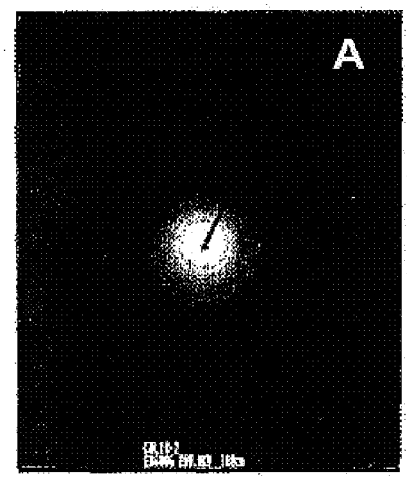
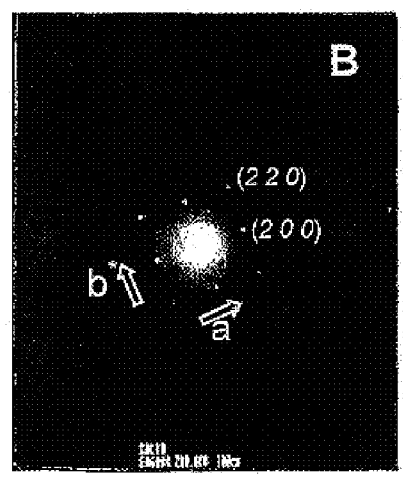

Fig. 21
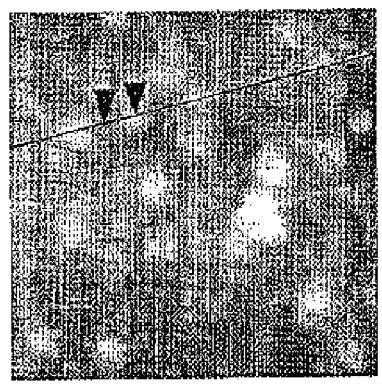 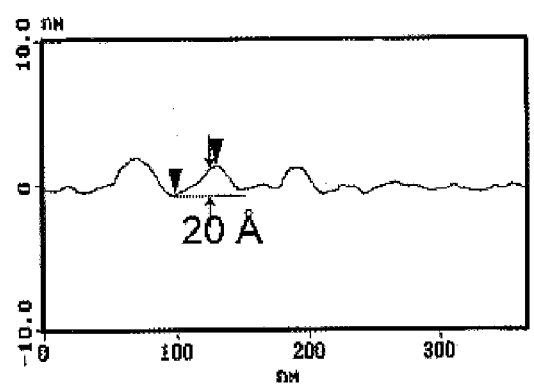
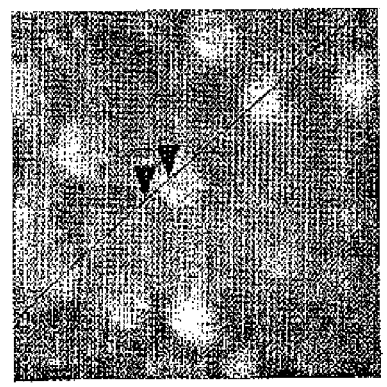 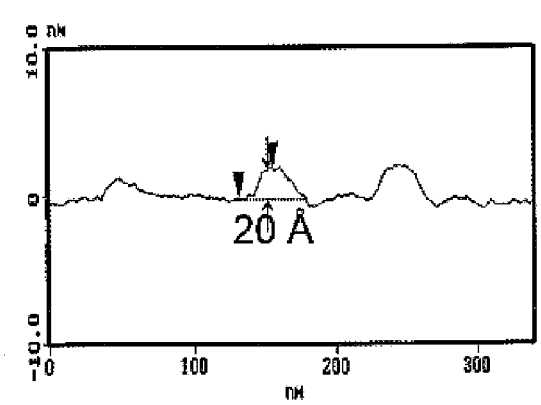

SUPERCONDUCTING COLLOIDS, SUPERCONDUCTING THIN LAYERS PRODUCED THEREFROM, AND PROCESSES FOR PRODUCING THEM

FIELD OF THE INVENTION

The present invention relates to applications of a multilayered superconducting material wherein a mercuric halide-organic complex is intercalated between the unit lattices of a Bi-based high-temperature superconductor. More specifically, the present invention relates to superconducting colloids produced by exfoliating the multilayered material, produced by intercalating mercuric halide between the layers of raw material, Bi-based high-temperature superconductor, and reacting said mercuric halide with a chain-like organic halide salt between layers, wherein oxide superconducting layers and organic layers alternately repeated in said multilayered material. The present invention also relates to a superconducting thin layer produced by using said colloid as a precursor and the process thereof.

BACKGROUND OF THE INVENTION

Sputtering, molecular beam epitaxy (MBE), laser ablation, chemical vapor deposition (CVD), etc. have hitherto been used as the technology for manufacturing superconducting thin layers. However, these technologies demand more complex techniques (high temperature, ultra-vacuum, etc.) and high costs. In addition, the processing time becomes very long when forming films of a micrometer in thickness. These technologies also have drawbacks in that they cannot easily be used to obtain films having a large surface area, and these techniques require a planar substrate. Further, a thin layer can be made by depositing a sol-gel and heat-treating it. In such instances, however, the quality of the thin layer deteriorates because the organic material is burned and escapes in the form of gas, and voids are formed on the surface thereby making the surface uneven. In the conventional manufacturing process of layers using electro-deposition, a layer is produced by grinding a superconductor or by electro-depositing a precursor solution. In the former, however, a thin layer cannot be produced because the particles are a micrometer in size, and, in the latter, the superconducting properties are formed only after heat-treatment at high temperatures.

Therefore, there has been a need in the art for an economical, convenient and rapid process for producing a superconducting thin layer.

A Bi-based superconductor is an oxide comprising Bi, Sr, Ca, Cu, etc., and can be represented by the formula shown below depending on the composition ratio and the number of copper-oxygen planes (m) included in a unit lattice:

$$Bi_2Sr_2Ca_{m-1}Cu_mO_{2m+4+\delta}$$

wherein m is 1, 2 or 3 and represents the number of copper-oxygen planes included in a unit lattice and $2m+4+\delta$ is the content of oxygen; wherein $\delta$ is a positive number greater than 0 and less than 1 and varies depending on synthesis conditions, such as the partial pressure of oxygen. In addition, each metal atom may be substituted with a different metal ion having a similar ionic radius. Accordingly, Bi may be substituted with Pb; Sr may be substituted with any one of La, Pr, Nd or Ca; Ca may be substituted with Y; and Cu may be substituted with any one of Co or Fe.

Because a Bi-based superconductor commonly has a weakly bonded Bi—O double layer, different chemical species may be intercalated between the double layer without causing a change in the metal oxide lattice. The Bi-based superconductor having iodine [Nature, 348, pp.145–147] or mercuric halide [J. Am. Chem. Soc. 116, 1994, pp. 11564–11565] intercalated therein is known as a superconducting intercalate. In this instance, however, the distance between layers cannot be readily controlled because the intercalates are all inorganic atoms or molecules.

In order to solve these problems, the inventors of the present invention previously synthesized a layered-structure superconductor, wherein a mercuric halide-organic material complex is intercalated between layers. The synthesis was carried out by reacting mercuric halide intercalated in a Bi-based superconductor with organic (cation)-halogen (anion) salt (Korean Patent Application No. 1997-50741; and Science, 280, 1998, pp.1589–1592). Using this procedure, it was readily possible to control the distance between the superconductor layers by intercalating an organic material having a saturated alkyl chain into the layered-structure Bi-based superconductor.

Before the present invention, however, there had not been any examples in which the superconducting material as disclosed in the above Korean patent application (wherein a mercuric halide-organic material is intercalated) is used in the preparation of a superconducting thin layer.

Since filing of the above Korean patent application, the inventors have continued to conduct research in this field, and have found that when the organic chain intercalated into a Bi-based high temperature superconductor is long, i.e., the number of carbon atoms is large, the distance between the layers becomes so great that the bond strength between the lattices of oxide superconductor can be disregarded. If the superconductor is washed with an aprotic organic solvent treated with supersonic waves, the mercuric halide-organic material complex intercalated between the layers is dissolved in the solvent, and the lattices of the superconductor can be exfoliated into each layer.

Further, the inventors have found that the aforesaid exfoliation procedure can be used to produce superconducting colloid particles having a molecular level thickness, and that a superconducting thin layer can be produced in an economical way by using these superconducting colloid particles as precursors in the production of superconducting thin layers.

PUROPOSE OF THE INVENTION

Accordingly, a purpose of the present invention is to provide a superconducting colloid that can be used as a precursor in the production of a superconducting thin layer. The superconducting colloid can be produced by using a Bi-based superconductor having an organic material intercalated therein, and the superconducting thin layer can be produced in an economical way by using the colloid as a precursor.

Another purpose of the present invention is to provide a process for producing the superconducting colloid of the invention.

Another purpose of the present invention is to provide a superconducting thin layer produced by using the superconducting colloid of the invention and the process for production thereof. The production of superconducting thin layers using the superconducting colloid according to the present invention and the electro-deposition method can be applied to a superconducting thin layer having a large area that cannot be produced in an established method or using a substrate with a three-dimensional shape, such as a curvature, a cylinder and the like. The process for forming superconducting thin layers of the invention can also be used in a variety of applications, such as magnetocardiography, where a magnetic field shielding is required, and electronics wherein a superconducting thin layer is used.

BRIEF DESCRIPTION OF THE FIGURES

FIG. 6 (1) is the X-ray diffraction patterns of (a) $(HgI_2)_{0.5}I_{0.5}$—(Bi, Pb)2223 (b) $[(Py-C_nH_{2n+1})_2HgI_4]_x$—(Bi, Pb)2223, n=4, (c) n=6, (d) n=8, (e) n=10 and (f) n=12.

FIG. 6 (2) is a graph showing the correlation between the length of the alkyl chain in the $[(Py-C_nH_{2n+1})_2HgI_4]_x$—(Bi, Pb)2223 layer and the increase in the distance between the layers.

FIG. 8 is two 2θ ranges of X-ray diffraction patterns of (a) dried powder of Bi2212 colloid solution and (b) the thin layer prepared by restacking concentrated Bi2212 colloid solution on a glass substrate.

FIG. 9 (2) is an electron diffraction pattern of the exfoliated Bi2212 crystal located at region A as indicated in FIG. 9 (1). FIG. 9 (3) is an electron diffraction pattern of the part where crystals are overlapped as indicated at region B in FIG. 9 (1). FIG. 9 (4) is a schematic showing that the two crystals are rotated 66° with respect to each other. These crystals are exfoliated from one to two crystals through an exfoliation process.

FIG. 10 is an AFM image of colloid particles under exfoliation. (a): One particle is exfoliating to three particles (that have the thickness of two or three unit layers); (b): The particle that is exfoliated and separated form the particle in (a) has the almost same thickness as that of a Bi2212 monolayer (15.3 Å).

FIG. 11 is an AFM image of Bi2212 colloid particles. The thickness of the colloid particles is about 15.3 Å and is nearly the same as that of a Bi2212 monolayer (15.3 Å).

FIG. 12 is a graph that shows the size distribution of colloid particles in solution after centrifugation. (A): the original Bi2212 colloid solution prior to centrifugation; (B): the supernatant after centrifugation at 5000 rpm for 10 min.; (C) the supernatant after centrifugation at 10000 rpm for 10 min.

FIG. 19 (1) shows the TEM image and an electron diffraction pattern of (Bi, Pb)2223 nano-sheet. FIG. 19 (2) shows an electron diffraction pattern of original lattice and the lattice that is not completely taken apart as represented by region A in FIG. 19 (1). ((Bi, Pb)2223 lattice was taken apart from the original lattice by exfoliation process); FIG. 19 (2) shows an electron diffraction pattern of (Bi, Pb)2223 nano-sheet as represented by region B in FIG. 19 (1).

FIG. 21 is an AFM image of exfoliated (Bi, Pb)2223 particles. The thickness of (Bi, Pb)2223 colloid particles is about 20 Å, which is almost the same as that of a (Bi, Pb)2223 monolayer (18.5 Å).

DETAILED DESCRIPTION OF THE INVENTION

Figure 1:
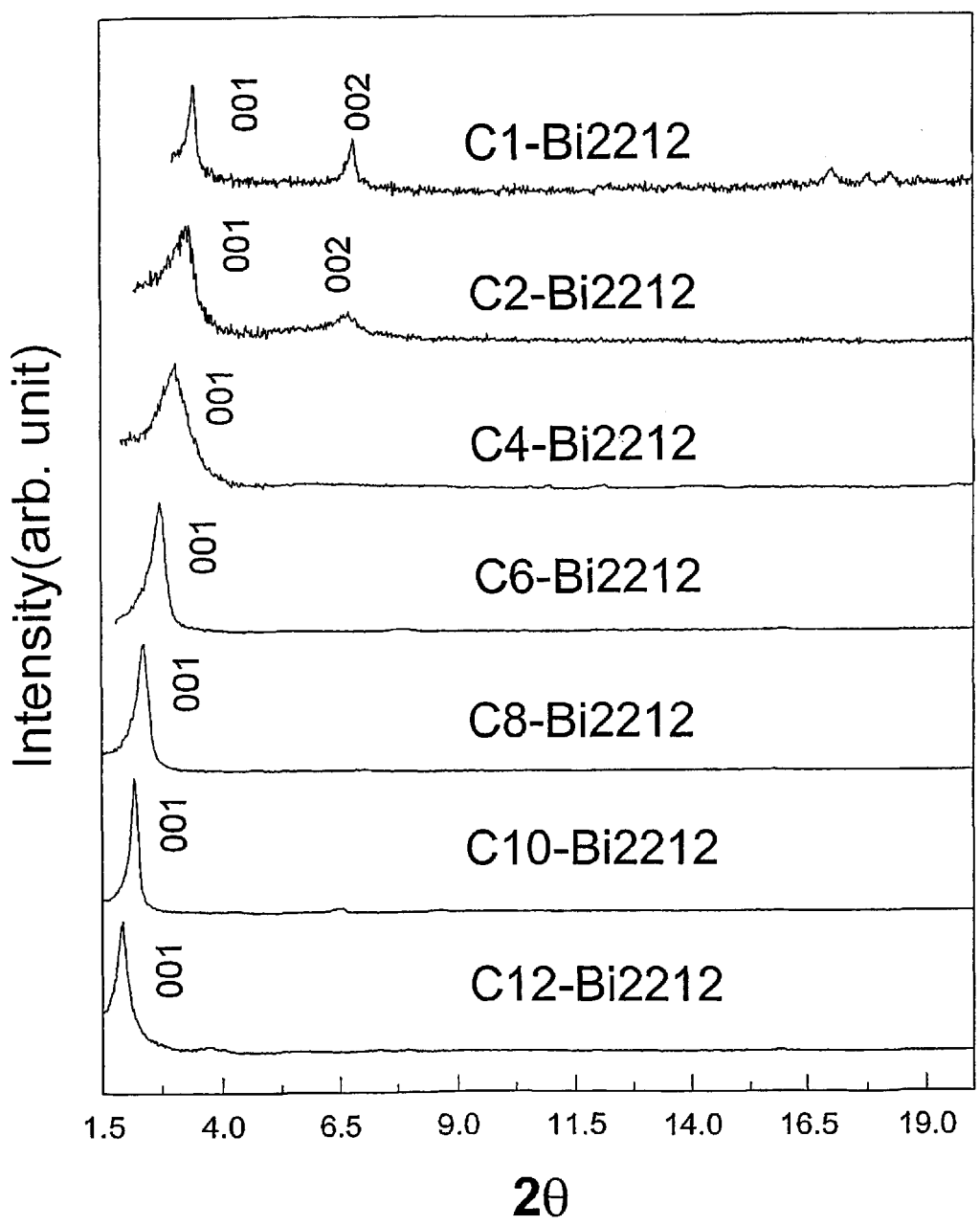
FIG. 1 is a series of X-ray diffraction patterns of Bi2212 superconductor powder in which organic complexes of different length are intercalated.

The present invention is explained below in more detail.

The process for producing superconducting colloids according to the present invention includes a step of exfoliating a Bi-based multilayered superconductor where a mercuric halide-organic material complex is intercalated between the unit lattices of the superconductor in an aprotic organic solvent.

The mercuric halide that can be intercalated into the multilayered superconductor, the raw material of the process according to the present invention, can be mercuric iodide ($HgI_2$) and mercuric bromide ($HgBr_2$), and the organic material can be primary ammonium halogenide salt ($R-NH_3^+X^-$), quaternary ammonium halogenide salt, or alkylpyridinium halogenide ($Py-C_nH_{2n+1}X$; X=Br, I), and the like. However, the combination of mercuric iodide and alkylpyridinium-iodide ($Py-C_nH_{2n+1}I$) is most preferred in view of the chemical stability of the superconductor lattice and the ease of intercalation. A $HgI_2Py_2$-Bi based superconductor is produced by forming an organometallic complex ($HgI_2Py_2$), having a neutral electrical charge, between the layers of the Bi-based superconductor through the reaction of the $HgI_2$-Bi based superconductor with a pyridine molecule. This also can be exfoliated as a chemical compound where an organic salt $[HgI_4(Py-C_nH_{2n+1})_2]$ is intercalated.

In the Bi-based superconductor where mercuric halide-organic material complex is intercalated, each superconducting layer can be exfoliated through appropriate physical-chemical treatment because the chemical bond strength between the oxide lattices becomes so weak as to be negligible as the distance between the unit layers of the superconductor increases due to the intercalation of the organic complex. That is, when the Bi-based superconductor, in which an organic complex is intercalated, is subjected to the washing and supersonic wave treatment in an aprotic organic solvent, the unit layers of the Bi-based superconductor, which had been weakly bonded and between which an organic layer is interposed, are separated into ultramicroscopic particles and become stable in the colloid state. It has been confirmed that the surface of such superconducting colloid particles has a positive charge. When a direct current electrical potential is applied between two parallel electrodes, the superconducting colloid particles are electro-deposited onto the cathode.

The choice of solvent is very important in the present invention. In the case of a protic solvent, it reacts with the oxide blocks of the superconductor to disintegrate the superconductor lattice and, as a result, the superconducting property disappears. Therefore, an aprotic solvent should be used. In addition, the solvent should be inexpensive in order to use the superconducting colloid on an industrial scale. The solvent should also be easily removable. A solvent having a boiling point of 40° C. to 190° C. is preferred. If the boiling point is lower than 40° C., it is difficult to handle the solvent due to high volatility, and if the boiling point is higher than 190° C., some problems may occur, for example, difficulty in removing the solvent after electro-deposition treatment, formation of voids on the surface of the film during the removal of solvent, and the like.

Since the organic material between the layers of the superconductor forms a salt, a solvent having a high dielectric constant is advantageous in solvating the salt. It is preferable for the solvent used in the present invention to have a dielectric constant of at least 20. Acetone is a suitable solvent for use in the present invention not only because it has a low boiling point but also because it has a relatively high dielectric constant. DMSO is also suitable for synthesis of the superconducting colloid according to the present invention but is less effective than acetone because it has much higher boiling temperature (b.p.=189° C.) than acetone.

The occurrence of exfoliation was confirmed by transmission electron microscopy (TEM), and it was also confirmed using electron diffraction analysis that the structure and the chemical stability of the superconductor lattice did not change during the exfoliation procedure. The size range of superconducting colloid particle of the invention is 80 to 270 nm (average size: approximately 200 nm). The size of the colloid particles can be controlled through centrifugation. The surface of a superconducting colloid particle carries an average positive charge of about 25.16 mV, and the colloid can be electro-deposited on various conductive substrates by using such a characteristic.

The process for producing the superconducting thin layer of the present invention includes the steps of electro-depositing and heat-treating the superconducting colloid produced by the above process.

In the electro-depositing step, a two- or three-electrode system is generally used. Since the potential of the working electrode is generally not constant in the two-electrode system, the three-electrode system is used, where a reference electrode maintains the constancy of the potential of the working electrode. Platinum, which is the most inert, is typically used as the reference electrode. Cu, Ag, Au, and the like can be used as the working electrodes.

When the Bi-based superconductor produced by the process of the present invention is used as a precursor in the production of a thin layer using an electro-depositing method, the thickness of the layer can be controlled from thin to thick by changing the voltage from several volts to several hundred volts, because the particle size is in the range of nanometers. A person skilled in the art can easily select suitable electro-depositing conditions.

In addition, smaller and more uniform particles can be selectively separated through centrifugation. The selected particles have the advantages that the particle growth is rapid even at a lower heat-treatment temperature and the production of a thin layer is easy. A particle size of 1 to 5000 nm is preferred. The heat-treatment time should be short for smaller particles of less than 1 nm. In such instances, however, the quality of the film deteriorates because the crystal growth is insufficient. If the particles are too large, it is also difficult to obtain a film with a clean surface because the crystal growth is slow during the heat-treatment, and the quality of the crystal is deteriorated. The electro-deposited superconducting thin layer is heat-treated at a high temperature for a certain period of time in order to improve its superconducting properties. It is preferred that the heat-treatment be conducted at 750 to 850° C. for 3 or more hours. When the heat-treatment was conducted at less than 750° C., a Bi2212 superconducting thin layer represented the Bi2201 phase. That is, this creates the problem of not being able to obtain a Bi2211 single phase, and causes insufficient crystal growth. This means that, when the size of the Bi2212 particles are reduced to the range of a nanometer, Bi2212 is re-synthesized through a phase transition during heat-treatment; this phenomenon was not known untill now.

When the superconducting thin layer coated on a metal surface in said method is subjected to heat-treatment, it converts to a thin layer in which the fine superconducting particles are combined and the superconducting layer is grown parallel to the substrate. The process for producing a thin layer by electro-depositing the superconducting colloid particles has an advantage in that a thin layer can be produced more economically and rapidly than by conventional processes, and the process of the invention is not restricted by the shape and size of the substrate.

The present invention is illustrated in more detail below with non-limiting examples.

EXAMPLES

Preparation Example 1

Preparation of Bi-based Superconducting Raw Material (Bi2212) Where Organic Material is Intercalated $Bi_2O_3$, $SrCO_3$, $CaCO_3$ and CuO were mixed in the molar ratio 2:3:3:4 and heat-treated at 840–850° C. in a solid phase reaction to produce $Bi_2Sr_2CaCu_2O_{8+\delta}$ in which Sr is partially replaced with Ca (nominal composition ratio: $Bi_2Sr_{1.5}Ca_{1.5}Cu_2O_{8+\delta}$). $Bi_2Sr_2CaCu_2O_{8+\delta}$(Bi2212), $HgI_2$ and $I_2$ were put into a pyrex glass tube in the molar ratio 1:5:0.5. The tube was sealed under vacuum and heated at 190° C. for 2 hours, then at 240° C. for 4 to 5 hours to produce a superconductor in which mercuric iodide is intercalated into the layers [$(HgI_2)_{0.5}Bi_2Sr_2CaCu_2O_{8+\delta}$].

An excessive amount, at least double amount of alkylpyridinium iodide salt was mixed into the superconductor in which mercuric iodide was intercalated [$(HgI_2)_{0.5}Bi_2Sr_2CaCu_2O_{8+\delta}$]. A small amount of acetone was added to the mixture and reacted at 40 to 70° C. for at least 6 hours. The reactants were washed and dried under vacuum to provide a superconductor in which an organic material was intercalated.

Figure 2:
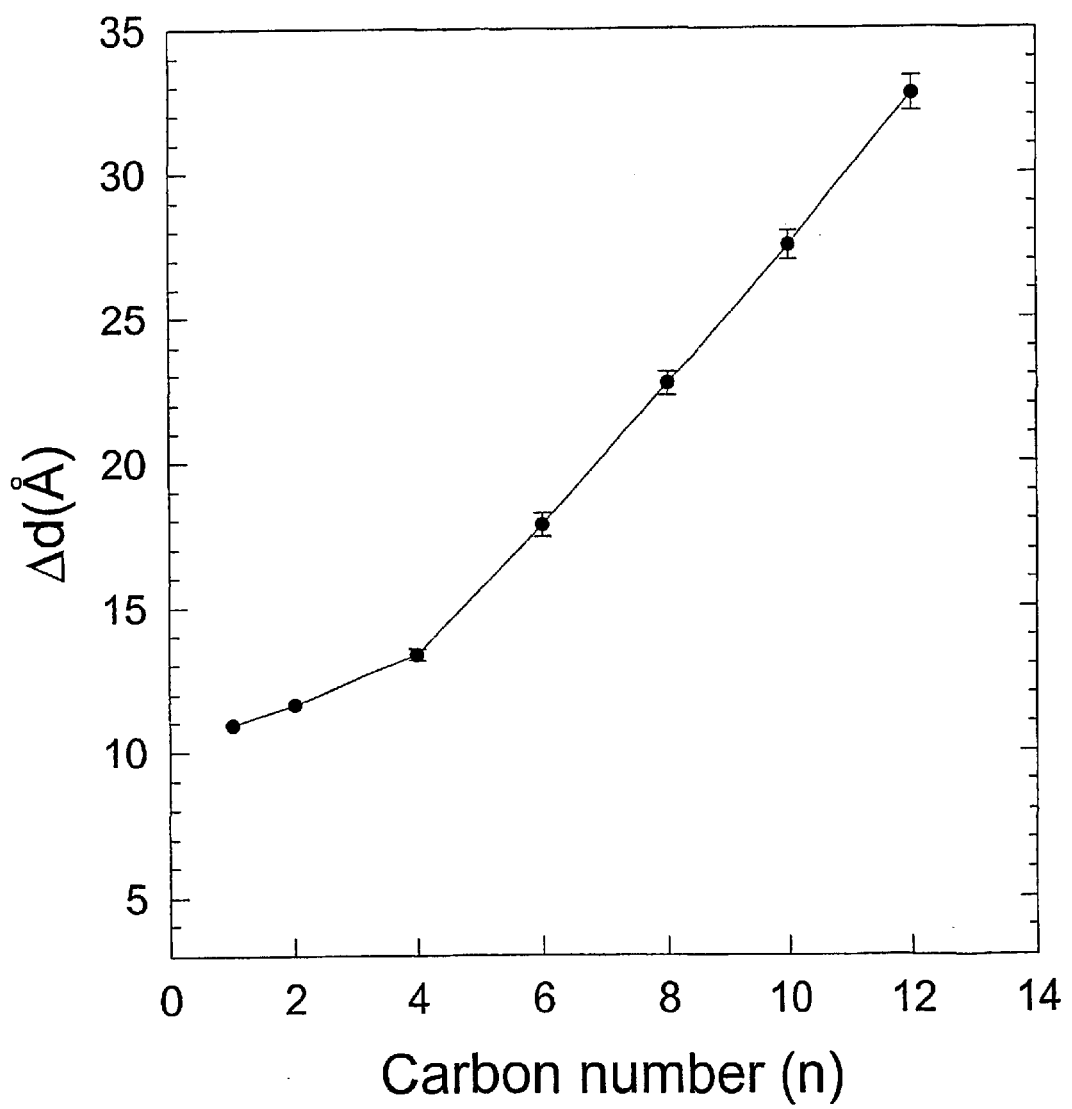
FIG. 2 is a graph showing the correlation between the number of carbon atoms of alkyl chain and the increase in the distance between the layers in the superconductor.

FIG. 1 illustrates the results of X-ray diffraction analysis depending on the number of carbons (n=1, 4, 8 and 12) of alkyl chain of alkylpyridinium. FIG. 2 shows that the distance between the layers increases depending on the length of the organic chain of alkylpyridinium. Where the number of carbons is small (n=1, 2), the same result could be obtained even in the absence of addition of the solvent and at a reaction temperature of 80 to 100° C. The superconducting critical temperature (Tc) of a Bi-based superconductor in which an organic material is intercalated is the same or slightly higher than that of the raw material.

Figure 3:
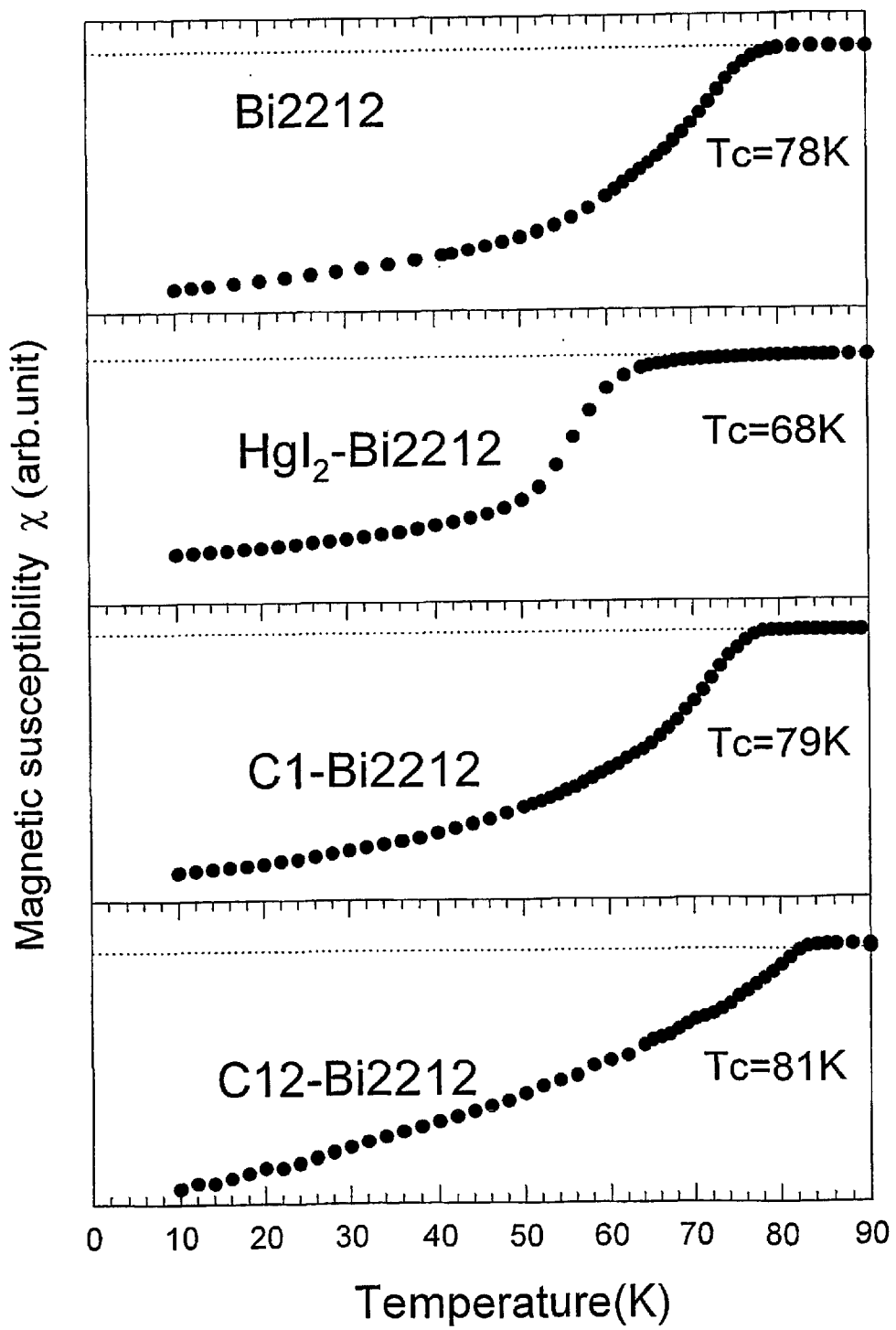
FIG. 3 is a graph that shows the results of the measurement of magnetic susceptibility of Bi-based superconductor and several different intercalates as a function of temperature.

FIG. 3 illustrates the result of the measurement of magnetic susceptibility of $Bi_2Sr_2CaCu_2O_{8+\delta}$ (Bi2212) in which an organic material is intercalated. The superconducting critical temperature is 1 to 3 K higher than that of the raw material.

Preparation Example 2

Preparation of Bi-based Superconducting Raw Material (Bi2201) Where Organics are Intercalated $Bi_2O_3$, $SrCO_3$, $La_2CO_3$ and CuO were mixed in the molar ratio 1:1.6:0.2:1 and heat-treated at 840–850° C. in a solid phase reaction to produce $Bi_2Sr_2CuO_{6+\delta}$ in which Sr is partially replaced with La (nominal composition ratio: $Bi_2Sr_{1.6}La_{0.4}CuO_{6+\delta}$). $Bi_2Sr_2CuO_{6+\delta}$ (Bi2201), in which organic material is intercalated, was produced by reacting the superconductor in which mercuric halide was intercalated with alkylpyridinium iodide, as in Preparation example 1.

Figure 4:
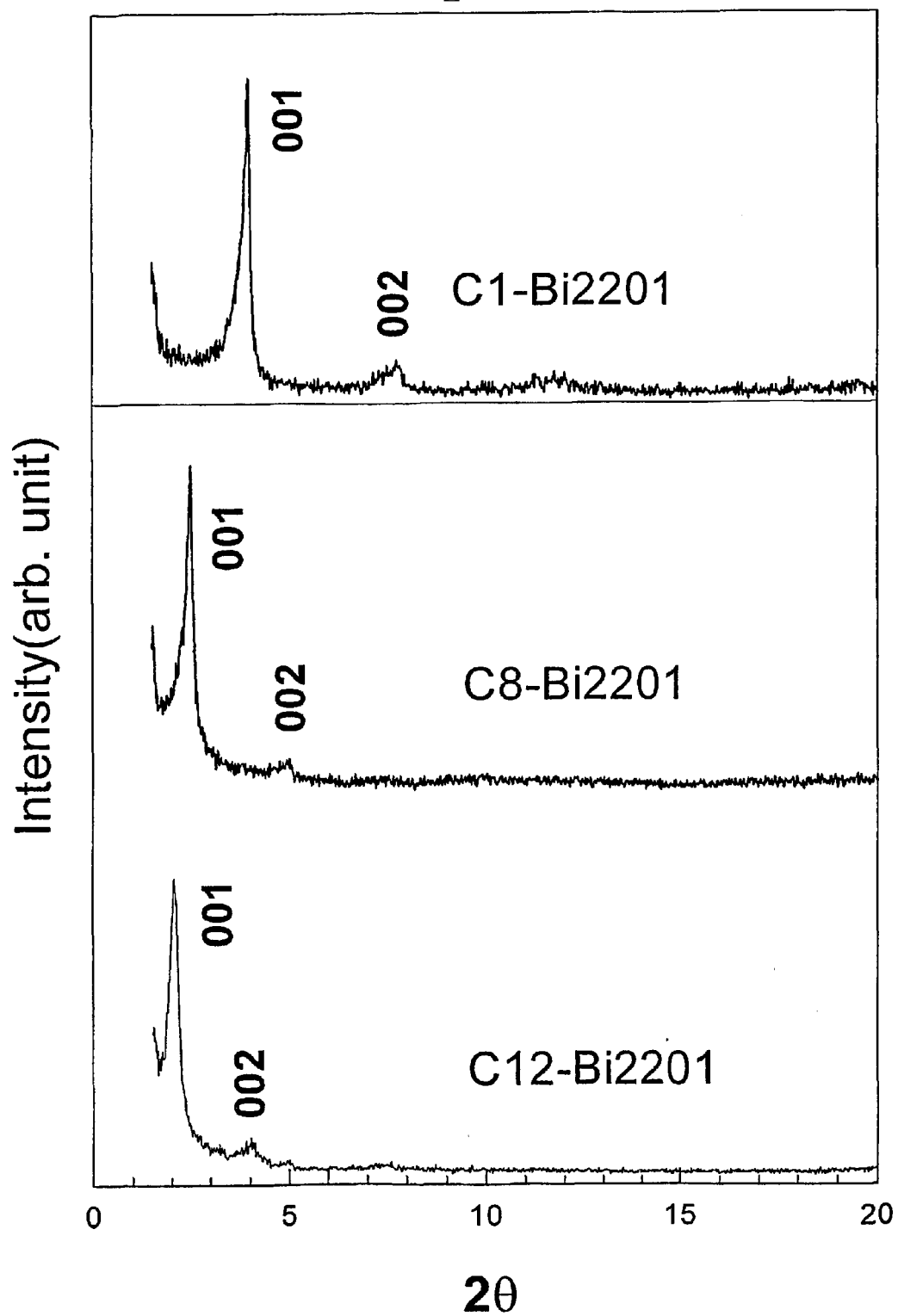
FIG. 4 is a series of X-ray diffraction patterns of Bi2201 superconductor powder in which organic material of different length is intercalated.

FIG. 4 shows that the results of X-ray diffraction analysis depend on the number of carbons (n=1, 8 and 12) of the alkyl chain of a Bi2201 superconductor in which an organic material is intercalated. As in Preparation example 1, the distance between the layers of the Bi2201 superconductor in which an organic material is intercalated increases as the chain length of the organic material increases.

Figure 5:
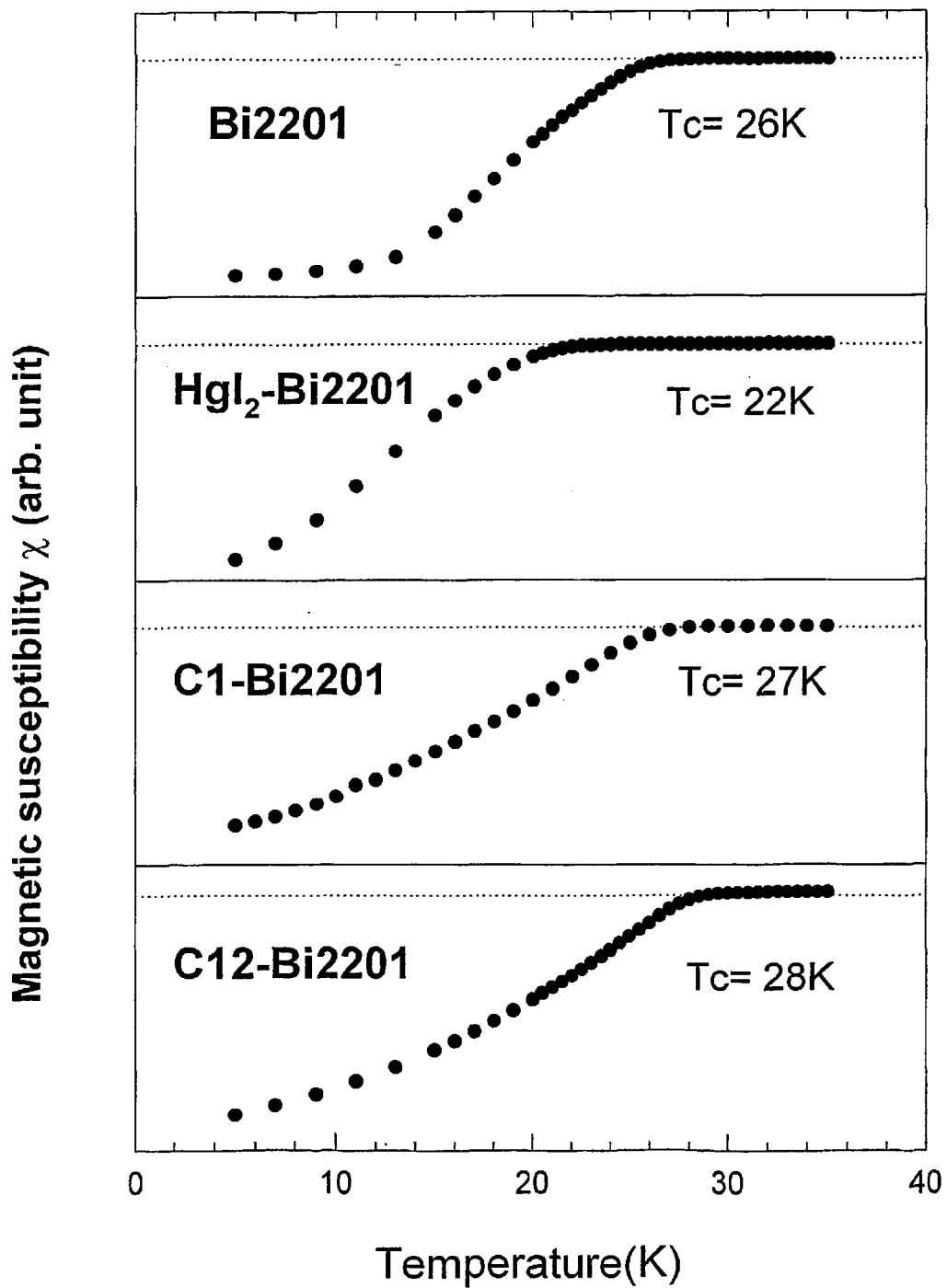
FIG. 5 is a graph that shows the results of the measurement of magnetic susceptibility of Bi2201 superconductor and several different intercalates as a function of temperature.

The superconducting critical temperature (Tc) of Bi2201 in which an organic material is intercalated is the same or slightly higher than that of the raw material. FIG. 5 shows the results of the measurement of magnetic susceptibility of the raw material, Bi2201, and Bi2201 in which organic material is intercalated. The superconducting critical temperature is 1 to 3 K higher than that of the raw material.

Preparation Example 3

Preparation of Bi-based Superconducting Raw Material (Bi2223) Where Organic Material is Intercalated $Bi_2O_3$, PbO, $SrCO_3$, $CaCO_3$ and CuO were mixed in the molar ratio 0.9:0.2:2:2:3 and heat-treated at 840–850° C. in a solid phase reaction to produce $Bi_2Sr_2Ca_2Cu_3O_{10+\delta}$ in which Bi is partially replaced with Pb (nominal composition ratio: $Bi_{1.8}Pb_{0.2}Sr_2Ca_2Cu_3O_{10+\delta}$). $Bi_2Sr_2Ca_2Cu_3O_{10+\delta}$ (Bi2223) in which organic material is intercalated was produced by intercalating mercuric iodide between the layers and reacting it with alkylpyridinium iodide, as in Preparation example 1.

FIG. 6 shows the results of X-ray diffraction analysis of Bi2223, which has an organic material having a long alkyl chain (n=6, 8 and 12).

Example 1

Preparation of Bi-based (Bi2212) Superconducting Colloid

The Bi2212, in which an organic complex salt [$(Py-C_nH_{2n+1})_2HgI_4$] was intercalated, was treated with supersonic waves in acetone, which is an aprotic polar solvent, to dissolve the intercalated mercuric iodide-organic material complex in the acetone, and the individual superconducting layer was exfoliated thereby.

Figure 7:
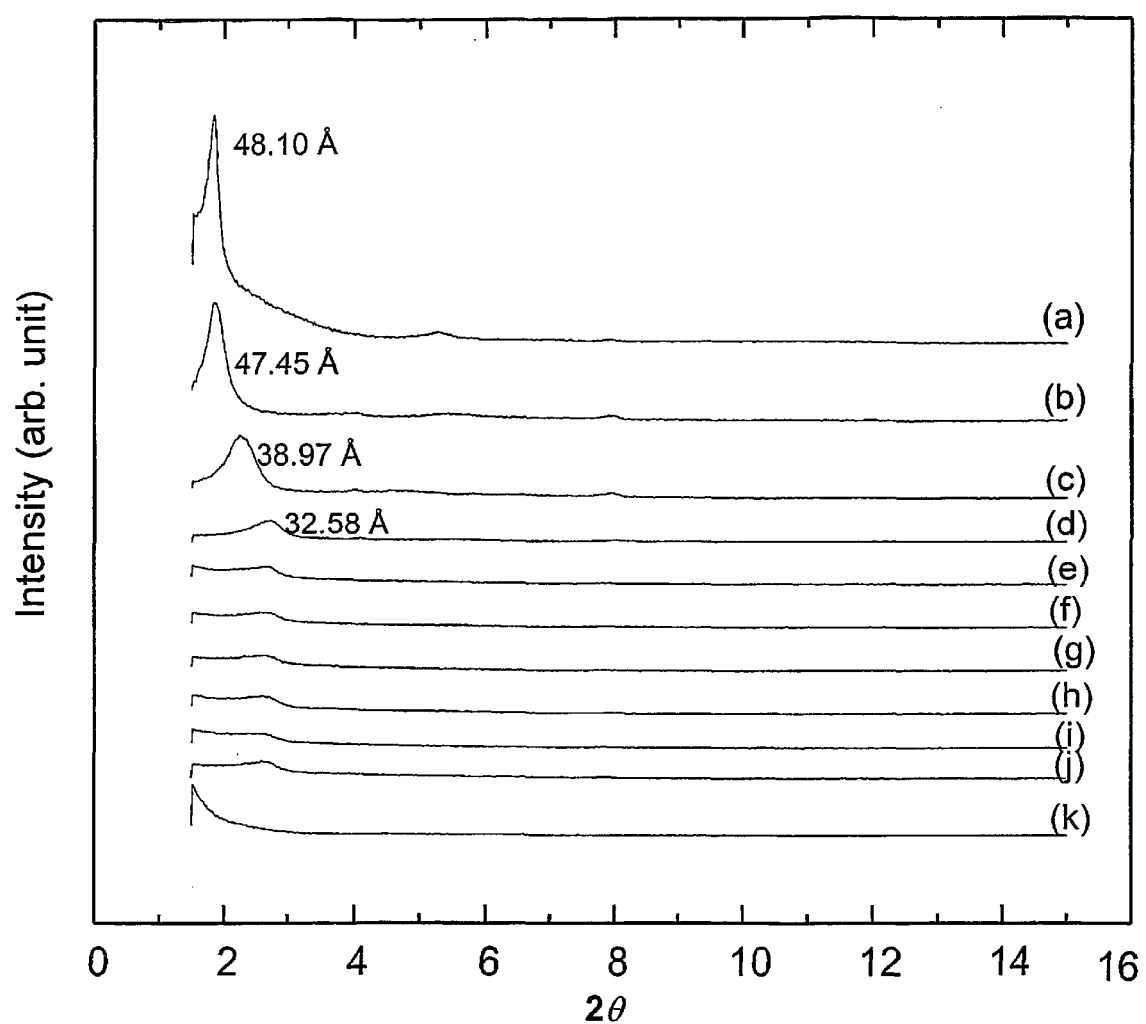
FIG. 7 is the X-ray diffraction patterns of Bi2212 in which mercuric iodide-organic material salt is intercalated after steps of washing with acetone and heat-treatment. (a) Bi2212 in which mercuric iodide-organic material salt is intercalated, (b) washing (×1), (c) washing (×2), (d) washing (×3), (e) washing (×4), (f) washing (×5), (g) treatment with supersonic wave (×1), (h) treatment with supersonic wave (×3), (i) treatment with supersonic wave (×5), (j) treatment with supersonic wave (×7) and (k) after drying the colloid solution.

FIG. 7 shows the X-ray diffraction in each step where the Bi2212, in which the mercuric iodide-organic material complex salt was intercalated, was washed with acetone and treated with supersonic waves. In this instance, the X-ray diffraction peak that corresponds to (002) shows an X-ray diffraction pattern similar to that of an amorphous state passing through each step. It can be interpreted that this is the result of random orientation of Bi2212 unit layers during exfoliation into each layer.

The X-ray diffraction pattern is again shown when the solution of the exfoliated superconducting colloid is concentrated, dropped onto a glass plate, and acetone is evaporated to allow the colloid particles to be arranged parallel to the surface of the glass plate. This can be interpreted as exfoliation of the mercuric halide-organic material complex into a state in which the complex is bonded to the surface of the unit layer of the superconductor.

FIG. 8 illustrates the results of the X-ray diffraction analysis of the colloid solution after being rapidly dried to particle form, and the comparison of said results with the results of the X-ray diffraction of thin layer that is prepared by slow drying concentrated colloid solution on the surface of the glass plate at room temperature and pressure and then drying at 150° C.

Example 2

Observation of the Exfoliation Process and Measurement of the Size of Colloid Particle In this Example, the exfoliation process of Bi2212, in which an organic material is intercalated, was confirmed with transmission electron microscopy (TEM).

Figure 9:
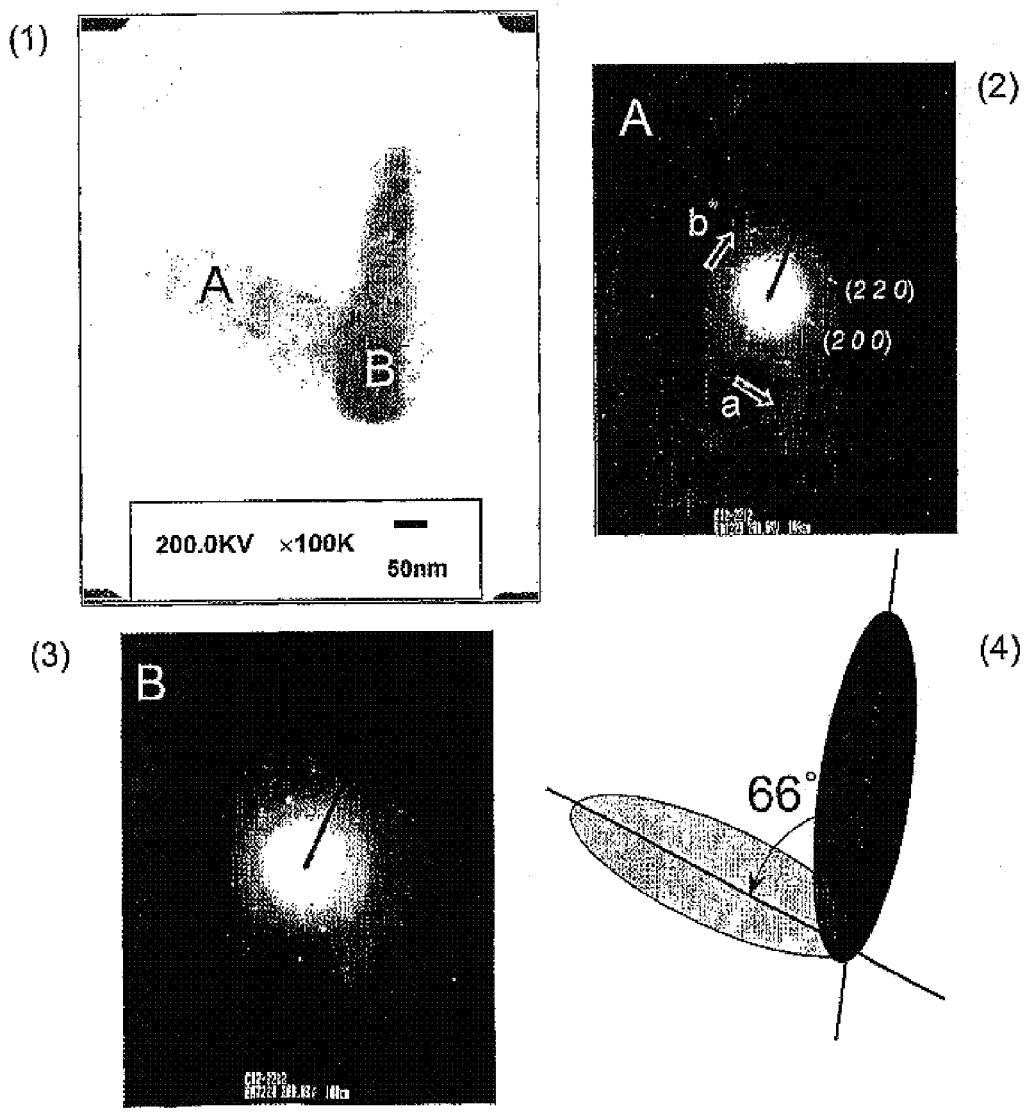
FIG. 9 (1) is a TEM image of a Bi2212 crystal after exfoliation.

FIG. 9 shows the TEM image and electron diffraction patterns of particles after exfoliation. The TEM image shows that one crystal splits into two crystals through the exfoliation process. The electron diffraction pattern of FIG. 9 (3) shows the electron diffraction patterns of two lattices having different orientations. This electron diffraction pattern illustrates that the superconducting layers retain their crystalline structure even during the exfoliation process.

FIG. 10 is an atomic force microscope (AFM) image showing one crystal exfoliating into three crystals through exfoliation of the colloid particle. As shown in FIG. 10, the crystal that was one before the exfoliation is exfoliating into three crystals. Two particles among them are exfoliating with a Bi2212 monolayer and an organic material being bonded, where the organic material is tilted 45 degrees in the layers. The other particle shows a c-axis thickness corresponding to a crystal containing an organic material intercalated between two Bi2212 monolayers. The thickness of one crystal that is believed to be separated from the same original crystal by exfoliation is almost the same as that of a Bi2212 monolayer.

In order to confirm whether the lattices are successfully exfoliated, the thickness of the superconducting colloid particle was measured using AFM. FIG. 11 shows the result of the AFM measurement of Bi2212 colloid particles. It can be confirmed from this figure that the thickness of each particle is approximately 15 Å, which is roughly the same as that of a Bi2212 monolayer. This observation also confirms that the superconducting layers are exfoliated into individual unit layers.

In this Example, the size of the exfoliated superconducting colloid particles was measured using a Zeta-Sizer, and it was confirmed that the average particle size distribution ranges from about 80 to 270 nm (average particle size: about 200 nm). It was also possible to separate the colloid particles on the basis of their size using centrifugation. FIG. 12 shows the particle size distribution of superconducting colloid obtained using centrifugation.

Figure 13:
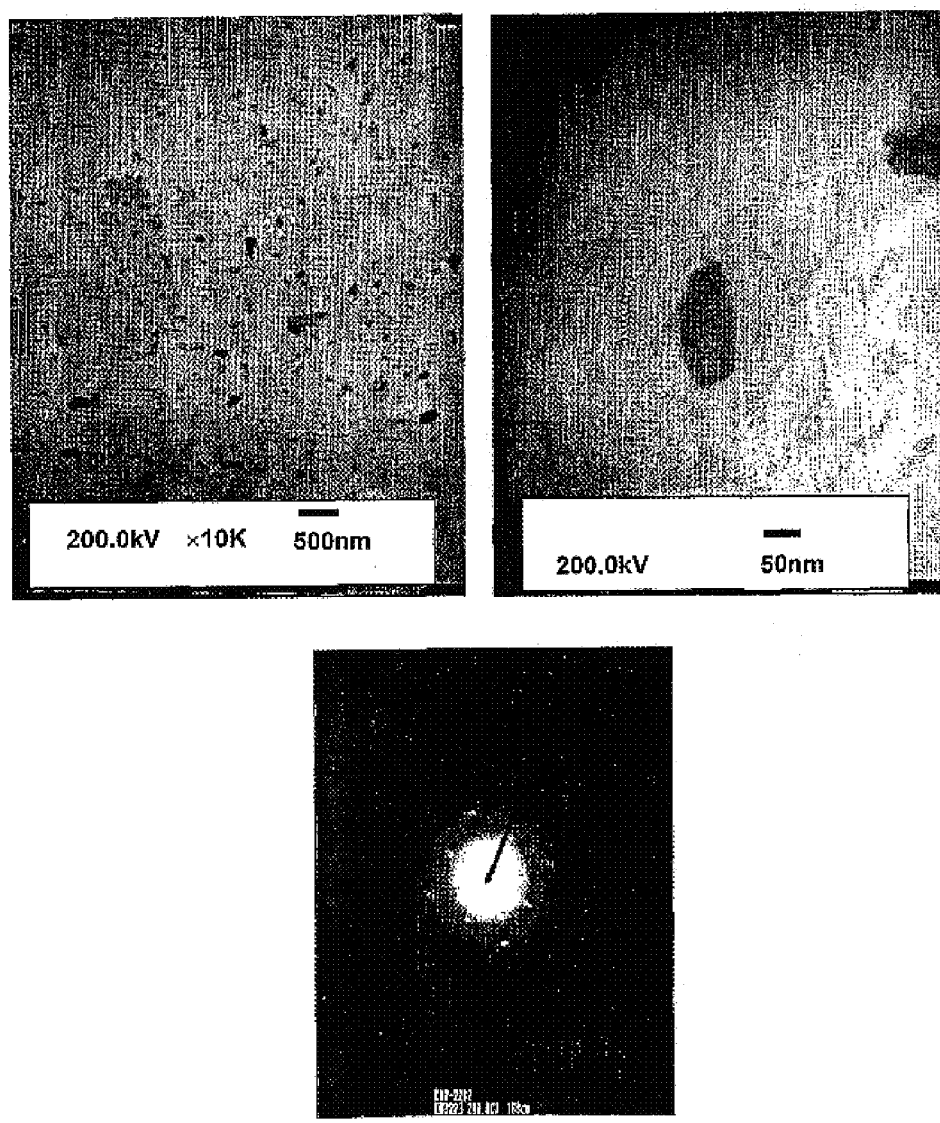
FIG. 13 shows two TEM images and an electron diffraction pattern of the superconducting colloid that was not centrifuged.

FIG. 13 shows TEM images of the particle size distribution of superconducting colloid that was not centrifuged.

Example 3

Preparation of Superconducting Thin Layer

Figure 14:
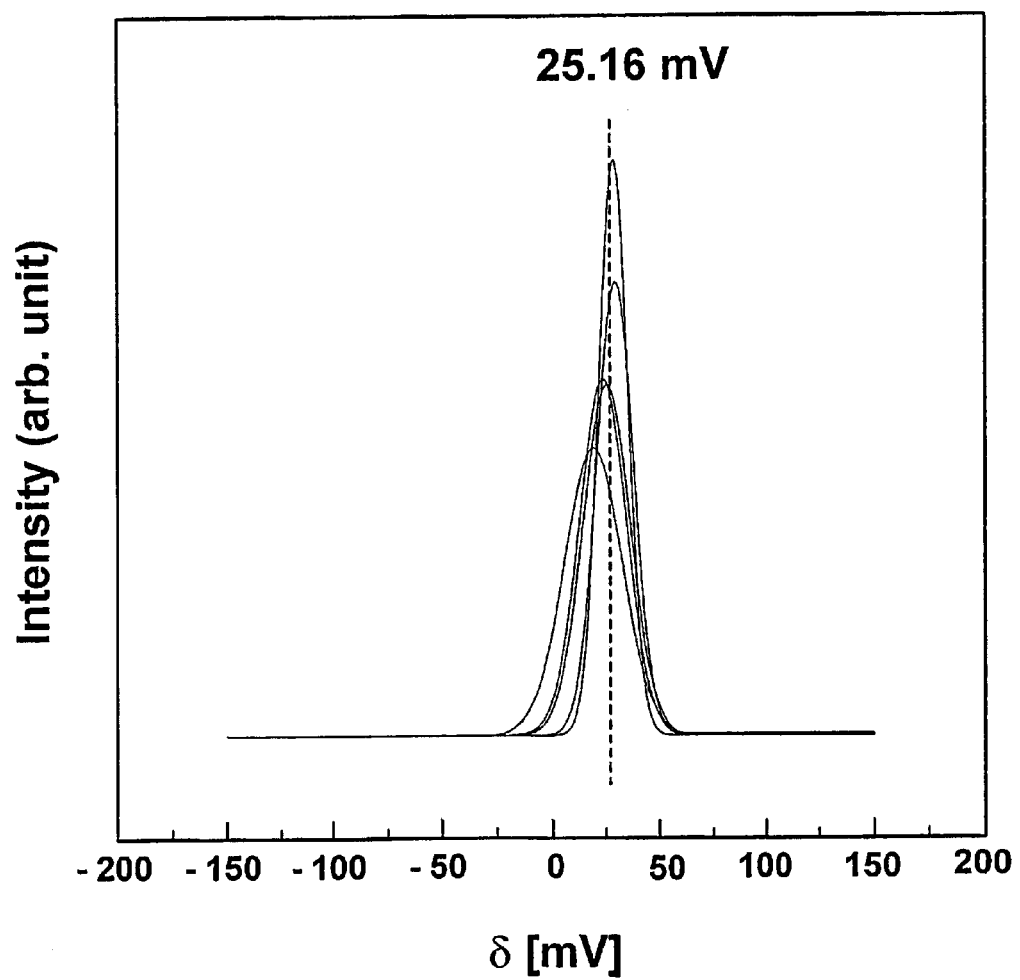
FIG. 14 is a graph that shows charge distribution of the exfoliated superconducting colloid particles. The average charge is 25.16 mV.

The superconducting colloid particles prepared according to the present invention have an average positive surface charge of about 25.16 mV. Using this characteristic, the superconducting colloid particles were coated on a metal substrate by electro-deposition, and a superconducting thin layer was produced therefrom through heat-treatment. FIG. 14 shows the average charge of the superconducting colloid particles.

Figure 15:
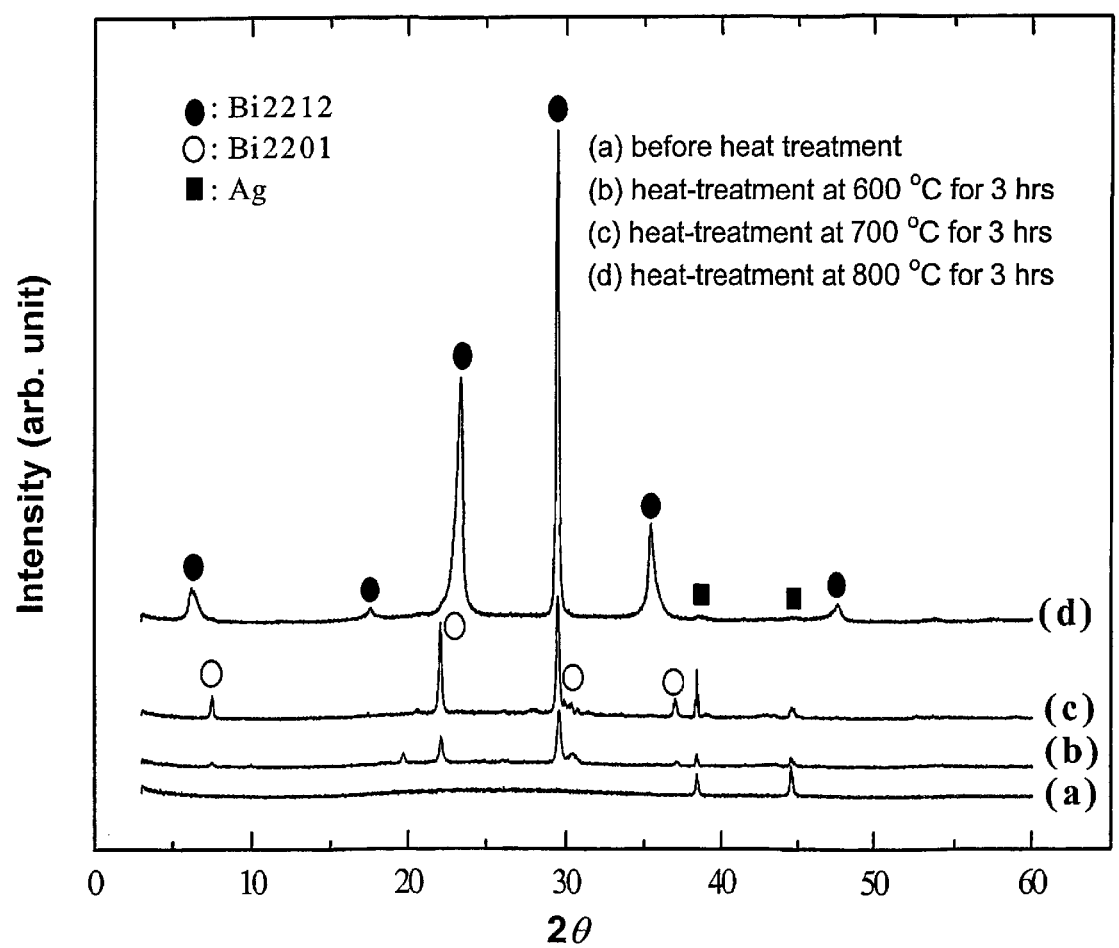
FIG. 15 shows X-ray diffraction patterns of (a) the thin layer after electro-deposition but before heat-treatment, (b) the thin layer heat-treated at 600° C. for 3 hours, (c) the thin layer heat-treated at 700° C. for 3 hours, and (d) the thin layer heat-treated at 800° C. for 3 hours.

The superconducting colloid that remained in the supernatant after centrifuging the Bi2212 superconducting colloid solution prepared in the method described in Example 1 at 5,000 rpm (2,370 g-force) was selected and electro-deposited on a silver substrate (electrode size: 1 cm$^2$; distance between electrodes: 3 cm; electric current: 1 mA; and voltage: 12 V). The thin layer produced by coating the superconducting colloid on a silver substrate shows an amorphous X-ray diffraction pattern. When the thin layer is heat-treated at 800° C., which is lower than the temperature for synthesis of the Bi2212 raw material, only the (001) peak of Bi2212 is shown in the result of the X-ray diffraction analysis. This results in which only a (001) X-ray diffraction peak is observed after heat-treatment, proves that the superconducting colloid particles are aligned parallel to the substrate like a single crystal, and that the crystal is well grown. FIG. 15 illustrates the X-ray diffraction analysis according to the heat-treatment step after electro-deposition.

The surface morphology of the thin layer produced according to the process of the present invention was confirmed using field emission-scanning electron microscope (FE-SEM) and AFM analysis. Analysis of FE-SEM images of an electro-deposited thin layer at various stages of heat-treatment confirmed that the exfoliated superconducting colloid particles are combined and that crystal growth occurs during the heat-treatment step.

Figure 16:
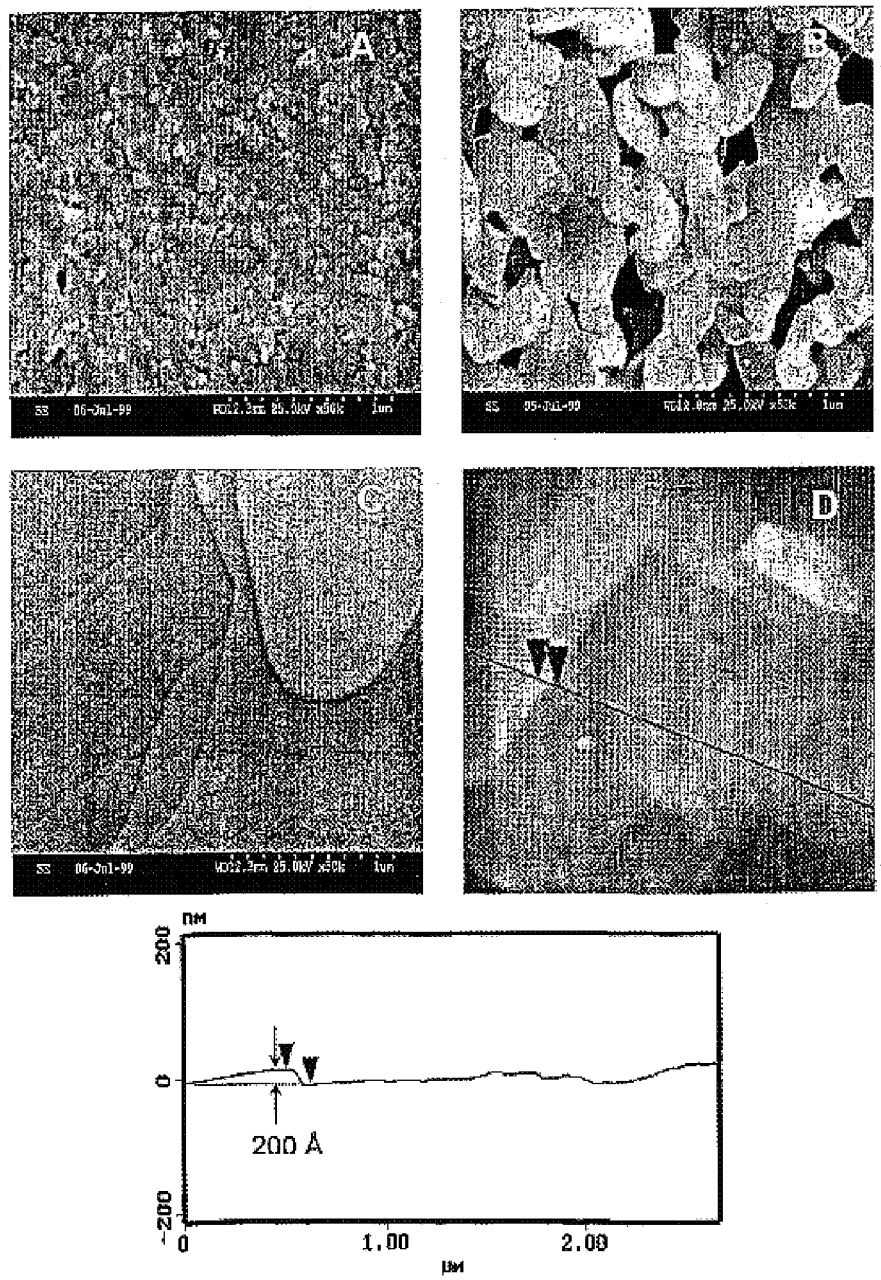
FIG. 16 shows three FE-SEM images and an AFM image of the Bi2212 thin layer prepared by electro-deposition. (A) is the thin layer after electro-deposition but before heat-treatment, (B) is the thin layer after heat-treatment at 700° C. for 3 hours, (C) is the FE-SEM image of the thin layer after heat-treatment at 800° C. for 3 hours, and (D) is the AFM image of the thin layer after heat-treatment at 800° C. for 3 hours.

FIG. 16 shows FE-SEM images of the thin layer at various stages of heat-treatment, and an AFM measurement of the thin layer in which the crystal was grown at 800° C. When the exfoliated superconducting crystals on the substrate are heat-treated at 600° C. and 700° C., some voids are formed in the thin layer due to the development of the bonding between the particles. When the thin layer was heat-treated at 800° C., the voids disappeared completely because the bonding between the particles further develops. As can be shown in the AFM results, the thin-layered crystal that was heat-treated at 800° C. was grown to a thickness of about 200 Å. The superconducting properties of the electro-deposited and heat-treated Bi2212 thin layer were determined by measuring the magnetic susceptibility of the thin layer. The results confirmed that the thin layer is a superconducting thin layer that transforms to a superconductor at 80K.

Figure 17:
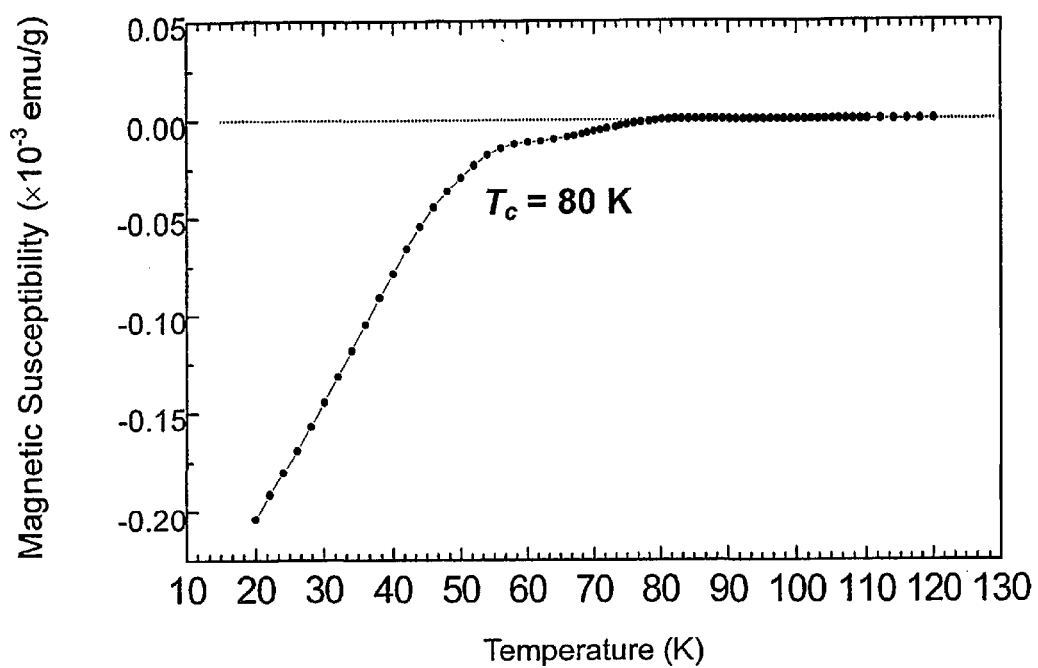
FIG. 17 is a graph showing the magnetic susceptibility of the Bi2212 thin layer heat-treated at 800° C. as a function of temperature.

FIG. 17 shows the results of the measurement of the magnetic susceptibility of Bi2212 superconducting thin layer that was heat-treated at 800° C.

Example 4

Preparation of Bi-based (Bi2223) Superconducting Colloid

The Bi2223 superconductor in which an organic material is intercalated, which was prepared in Preparation example 3, was treated with supersonic waves in acetone to dissolve the intercalated mercuric iodide-organic material complex in acetone, and the individual superconducting layers were exfoliated thereby.

Figure 18:
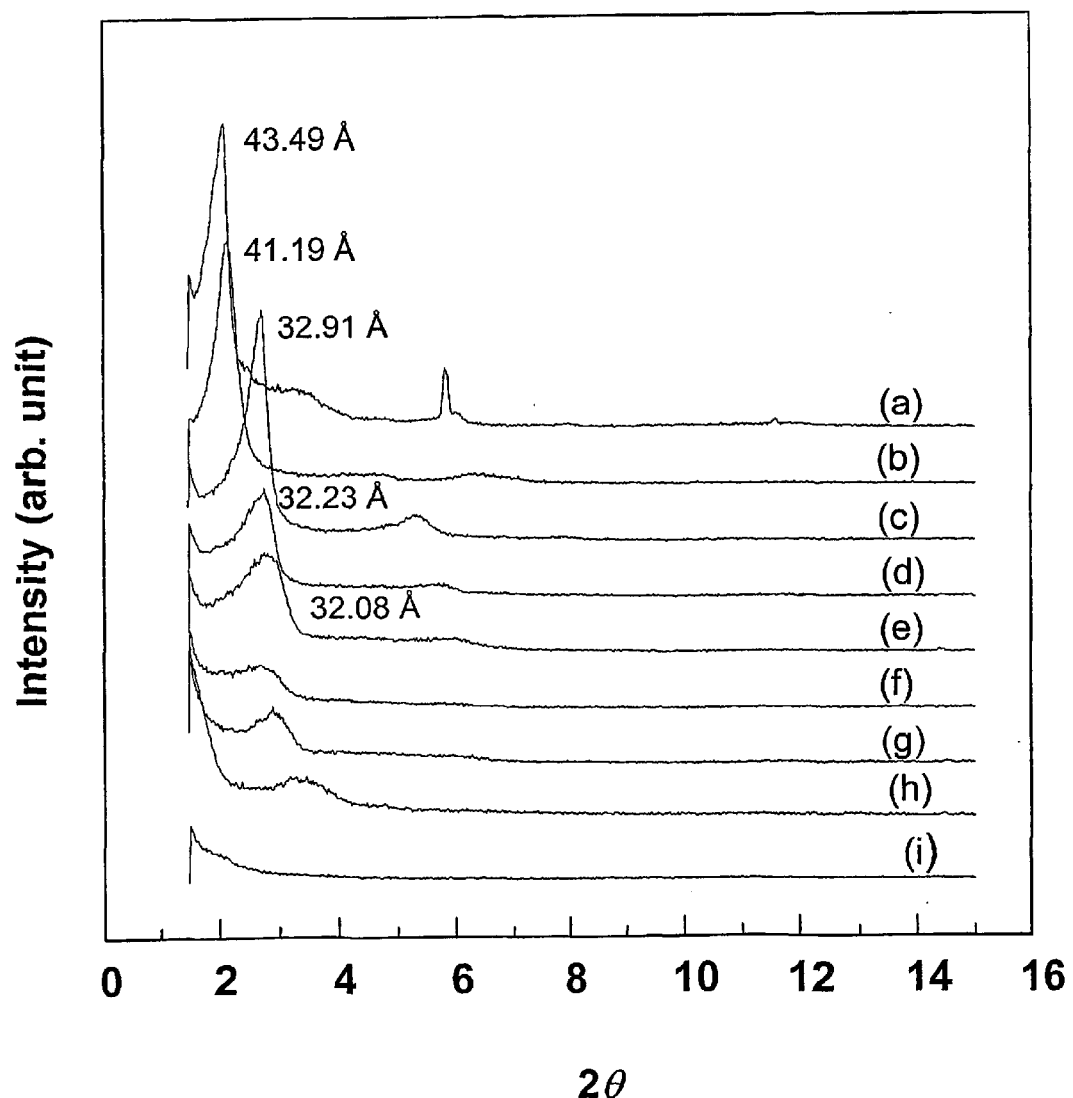
FIG. 18 is a diagram that shows the change in the X-ray diffraction pattern ((002) peak) of $[(Py-C_{10}H_{21})_2HgI_4]_x$—(Bi, Pb)2223 during the process of washing and treating with supersonic waves in acetone. (a) before washing ($[(Py-C_{10}H_{21})_2HgI_4]_x$—(Bi, Pb)2223); (b) washing (×1); (c) washing (×2); (d) washing (×3); (e) washing (×4); (f) washing (×5); (g) treatment with supersonic wave (×1); (h) treatment with supersonic wave (×5) (each supersonic wave treatment is conducted at 28 Hz for 10 min.); and (i) after drying the solution of step (h). After being treated five times with supersonic waves, (Bi, Pb)2223 is in a colloid state.

FIG. 18 shows the X-ray diffraction patterns of Bi2223, in which a mercuric iodide-organic complex salt is intercalated, after each step of washing with acetone and treating with supersonic waves. For each step, the X-ray peak that corresponds to (002) shows an X-ray diffraction pattern that is similar to that of the amorphous state. This means that the unit layers of Bi2223 have random orientations while they are exfoliated to individual layers.

Example 5

Confirmation of the Stability of the Crystal Structure of the Main Bi2223 Colloid Particle and That of Exfoliation Particles The stability of the crystal structure of the main Bi2223 colloid particle that was treated by the exfoliation process of Example 4 and the particle after exfoliation was confirmed from the TEM images and the electron diffraction pattern. The electron diffraction pattern of the exfoliated Bi2223 shows the characteristic diffraction pattern of Bi2223. Therefore, this means that the crystal structure and the chemical stability of the oxide lattice of Bi2223 are maintained even after exfoliation.

FIG. 19 shows the TEM image and electron diffraction pattern of a Bi2223 colloid particle. The Bi2223 colloid particles have an average size of about 200 nm, which was measured using a Zeta-Sizer.

Figure 20:
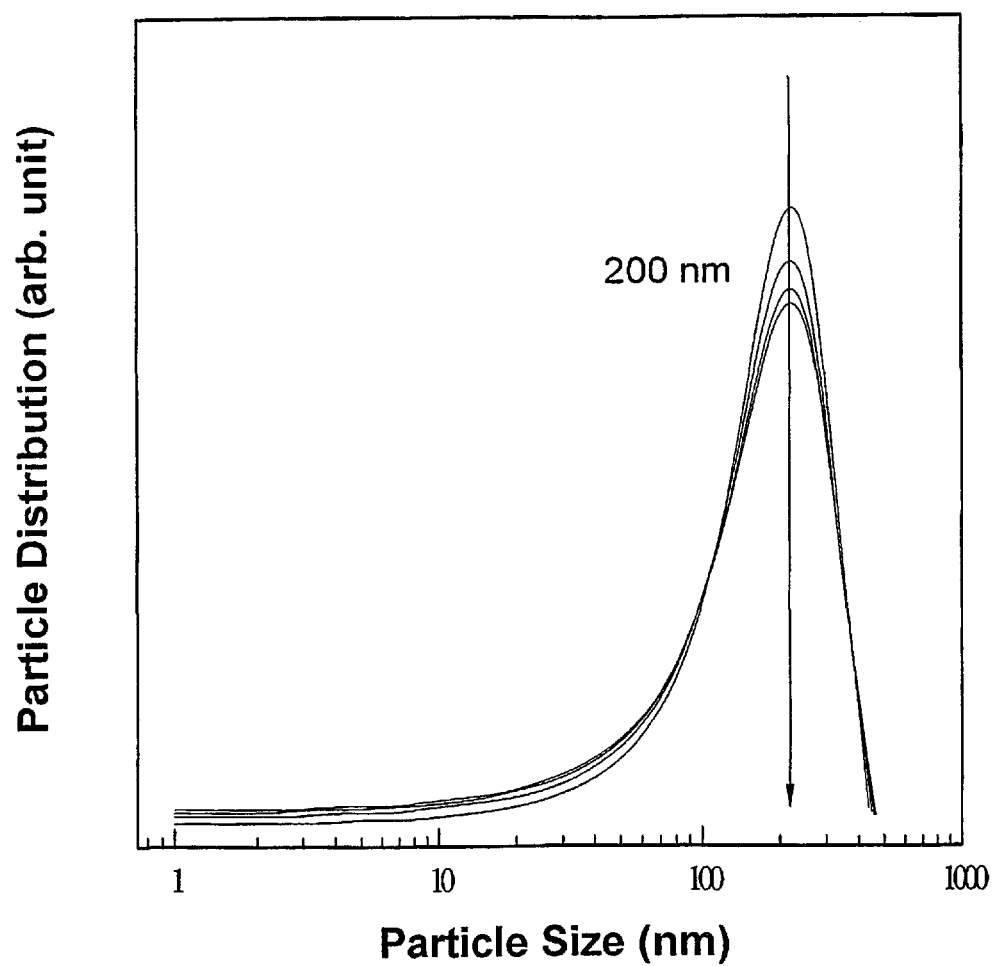
FIG. 20 is a drawing that shows the size distribution of (Bi, Pb)2223 colloid. For reproducibility of the experiment, the experiment was conducted 4 times on the same colloid solution.

FIG. 20 illustrates the size distribution of Bi2223 colloid particles. The thickness of colloid particle is about 20 Å, which is almost the same as that of a Bi2223 unit layer, 18.5 Å. From this, it is confirmed that Bi2223 superconducting layers are also exfoliated into individual unit layers as for Bi2212 of Example 2. FIG. 21 illustrates the results of the AFM measurement of Bi2223 colloid particles.

INDUSTRIAL APPLICABILITY

The process for preparing a superconducting thin layer according to the present invention has superior advantages in view of cost and ease of preparation relative to conventional processes where the components of superconductor and insulator are evaporated and alternatively deposited under vacuum.

In addition, the thickness of the insulating layer between the superconducting layers can be uniformly and easily regulated by controlling the chain length of intercalating organics. It is expected that the above material, having a multilayered structure of a high temperature superconductor-organic material, can be applied to a high sensitivity magnetic sensor and a X-ray sensor because its manufacturing cost is low and the synthesis is easy.

Another characteristic of the process according to the present invention is that a superconducting thin layer having very good crystal growth at much lower temperatures than for large particles can be economically produced by coating the exfoliated superconducting particles in an organic solvent on a substrate by way of electro-deposition, and the like, and heat-treating the coated film because the exfoliated superconducting particles are fine particles. Further, a superconducting thin layer or wire can be produced by the process regardless of the shape of the substrate, and the process is applicable to a magnetic field shield device or a superconducting electronic circuit.

What is claimed is:

1. A colloid prepared by exfoliating Bi-based superconductor, in which a mercuric halide-organic material complex is intercalated, in a polar aprotic organic solvent, where the superconductor is represented by the following formula:

$$Bi_2Sr_2Ca_{m-1}Cu_mO_{2m+4+\delta}$$

wherein, m is 1, 2 or 3, and

δ is a positive number and 0<δ<1.

2. The colloid according to claim 1, wherein the organic material is selected from the group consisting of alkylammonium halogenide salt, quaternary alkylammonium halogenide salt and alkylpyridinium halogenide salt.

3. The colloid according to claim 1, wherein the mercuric halide is mercuric iodide or mercuric bromide.

4. The colloid according to claim 1, wherein the organic material is alkylpyrdinium halogenide salt and the mercuric halide is mercuric iodide ($HgI_2$).

5. The colloid according to claim 1, wherein Bi is replaced with Pb; or Sr is replaced with any one of La, Pr, Nd and Ca; or Ca is replaced with Y; or Cu is replaced with any one of Co and Fe.

6. The colloid according to claim 1, wherein the polar aprotic organic solvent has a boiling temperature of 40 to 190° C. and a dielectric constant of at least 20.

7. A process for producing superconducting colloid comprising a step of exfoliating Bi-based superconductor, in which a mercuric halide-organic material complex is intercalated, in a polar aprotic organic solvent, where the superconductor is represented by the following formula:

$$Bi_2Sr_2Ca_{m-1}Cu_mO_{2m+4+\delta}$$

wherein, m is 1, 2 or 3, and

δ is a positive number and 0<δ<1.

8. The process according to claim 7, wherein the organic material is selected from the group consisting of alkylammonium halogenide salt, quaternary alkylammonium halogenide salt and alkylpyridinium halogenide salt.

9. The process according to claim 7, wherein the mercuric halide is mercuric iodide or mercuric bromide.

10. The process according to claim 7, wherein the organic material is alkylpyridinium halogenide salt and the mercuric halide is mercuric iodide ($HgI_2$).

11. The process according to claim 7, wherein Bi is replaced with Pb; or Sr is replaced with any one of La, Pr, Nd and Ca; or Ca is replaced with Y; or Cu is replaced with any one of Co and Fe.

12. The process according to claim 7, wherein the polar aprotic organic solvent has a boiling temperature of 40 to 190° C. and a dielectric constant of at least 20.

13. A Bi-based superconducting thin layer produced by using the superconducting colloid according to claim 1.

14. A process for producing Bi-based superconducting thin layer comprising electro-depositing the superconducting colloid according to claim 1 and heat treating the electro-deposited thin layer.

15. The process according to claim 14, wherein the heat-treatment is conducted at 750 to 850° C. for at least 3 hours.

* * * * *